US008722510B2

(12) United States Patent
Watanabe et al.

(10) Patent No.: US 8,722,510 B2
(45) Date of Patent: May 13, 2014

(54) TRENCH-FILLING METHOD AND FILM-FORMING SYSTEM

(75) Inventors: Masahisa Watanabe, Nirasaki (JP); Kazuhide Hasebe, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 234 days.

(21) Appl. No.: 13/194,426

(22) Filed: Jul. 29, 2011

(65) Prior Publication Data

US 2012/0028437 A1    Feb. 2, 2012

(30) Foreign Application Priority Data

Jul. 29, 2010  (JP) .................................. 2010-170115
Jun. 29, 2011  (JP) .................................. 2011-144733

(51) Int. Cl.
  *H01L 21/76*    (2006.01)
(52) U.S. Cl.
  USPC .................................. 438/431; 257/E21.547
(58) Field of Classification Search
  USPC .................................. 438/431; 257/E21.547
  See application file for complete search history.

(56) References Cited

U.S. PATENT DOCUMENTS

| 4,847,214 | A  | * | 7/1989  | Robb et al.     | 438/430 |
|-----------|----|---|---------|-----------------|---------|
| 5,869,384 | A  | * | 2/1999  | Yu et al.       | 438/431 |
| 7,112,513 | B2 | * | 9/2006  | Smythe et al.   | 438/431 |
| 7,947,551 | B1 | * | 5/2011  | Syue et al.     | 438/218 |
| 8,431,494 | B2 | * | 4/2013  | Murakami et al. | 438/770 |
| 8,455,369 | B2 | * | 6/2013  | Watanabe et al. | 438/763 |
| 2005/0085054 | A1 | * | 4/2005 | Chakravarti et al. | 438/478 |
| 2009/0029532 | A1 | * | 1/2009 | Huang et al. | 438/479 |
| 2010/0193664 | A1 | * | 8/2010 | Stoddard | 249/114.1 |
| 2010/0311232 | A1 | * | 12/2010 | Hwang | 438/591 |
| 2010/0311251 | A1 | * | 12/2010 | Okada et al. | 438/761 |
| 2011/0263105 | A1 | * | 10/2011 | Hasebe et al. | 438/482 |
| 2011/0287629 | A1 | * | 11/2011 | Kakimoto et al. | 438/652 |
| 2011/0312192 | A1 | * | 12/2011 | Murakami et al. | 438/787 |
| 2012/0164842 | A1 | * | 6/2012 | Watanabe et al. | 438/763 |
| 2013/0005142 | A1 | * | 1/2013 | Kakimoto et al. | 438/658 |
| 2013/0023110 | A1 | * | 1/2013 | Kakimoto et al. | 438/482 |
| 2013/0052795 | A1 | * | 2/2013 | Watanabe | 438/427 |

FOREIGN PATENT DOCUMENTS

| JP | 2008-124211 A    | 5/2008 |
| KR | 10-2008-0026765 A | 3/2008 |
| KR | 10-2009-0047002 A | 5/2009 |

* cited by examiner

*Primary Examiner* — William F Kraig
*Assistant Examiner* — Joseph C Nicely
(74) *Attorney, Agent, or Firm* — Nath, Goldberg & Meyer; Jerald L. Meyer

(57) ABSTRACT

A method of filling a trench comprises heating a semiconductor substrate having a trench formed therein and an oxide film formed at least on the sidewall of the trench and supplying an aminosilane gas to the surface of the substrate so as to form a seed layer on the semiconductor substrate, heating the semiconductor substrate having the seed layer formed thereon and supplying a monosilane gas to the surface of the seed layer so as to form a silicon film on the seed layer, filling the trench of the semiconductor substrate, which has the silicon film formed thereon, with a filling material that shrinks by burning, and burning the semiconductor substrate coated by the filling material filling the trench in an atmosphere containing water and/or a hydroxy group while changing the filling material into a silicon oxide and changing the silicon film and the seed layer into a silicon oxide.

11 Claims, 17 Drawing Sheets

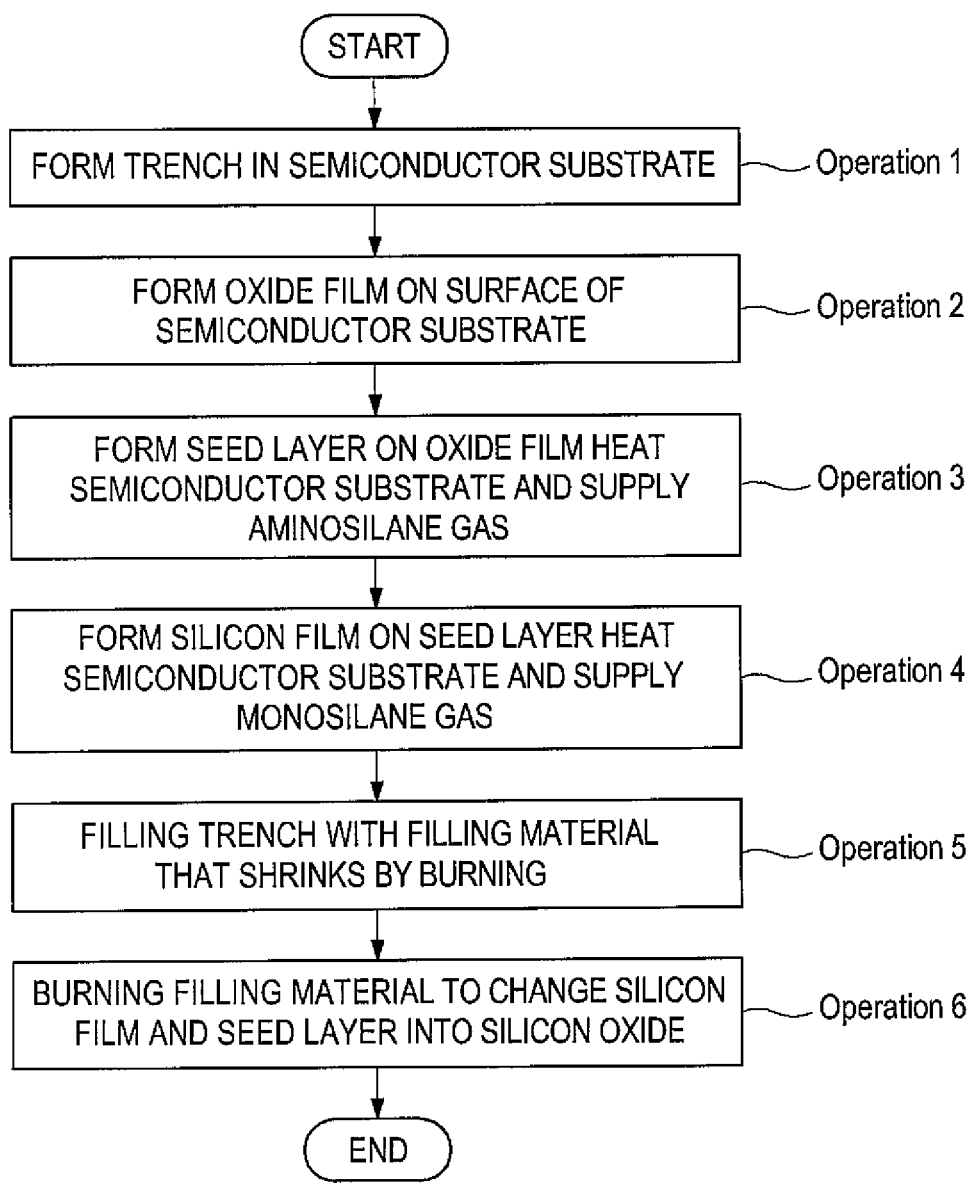

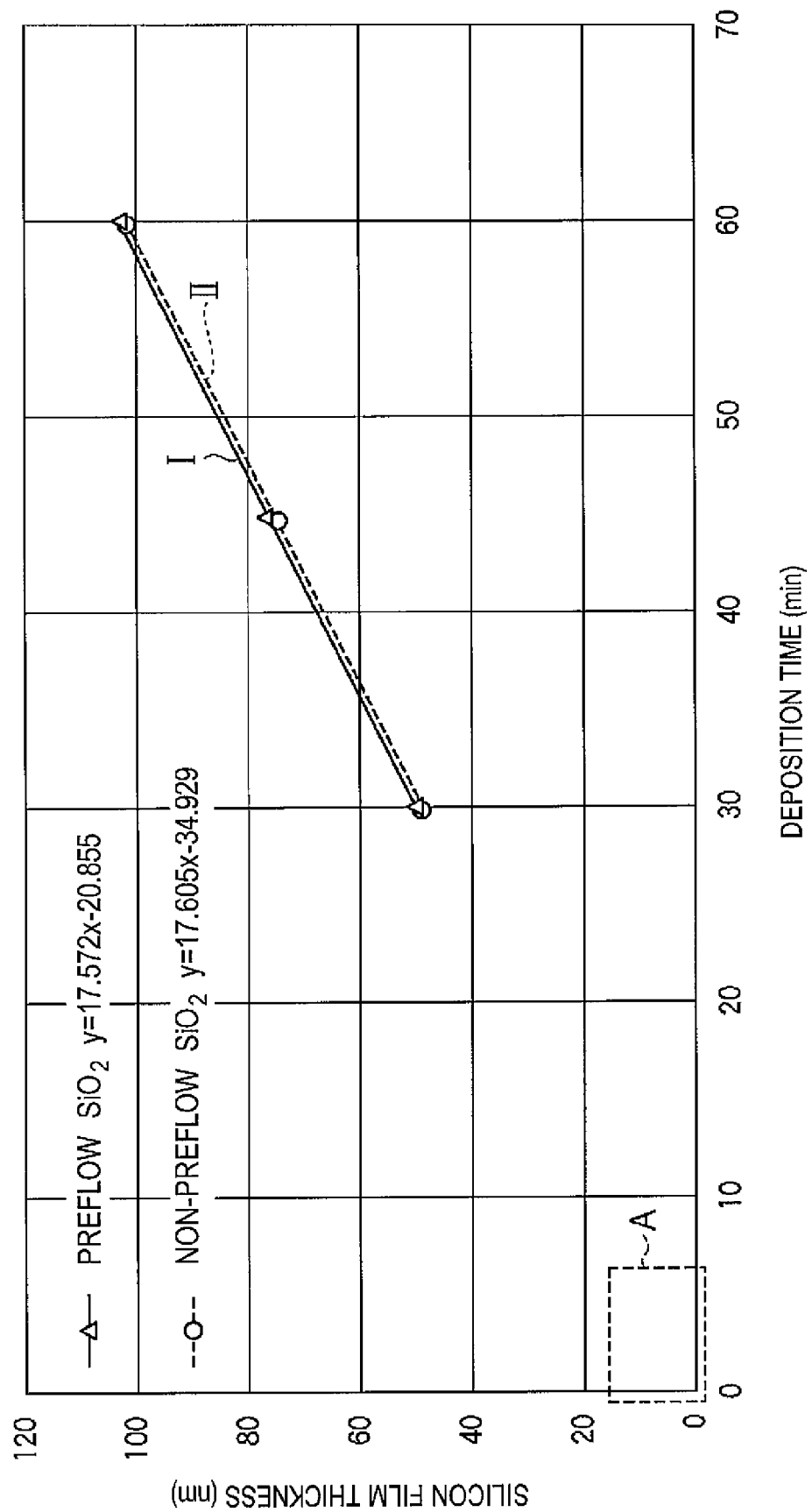

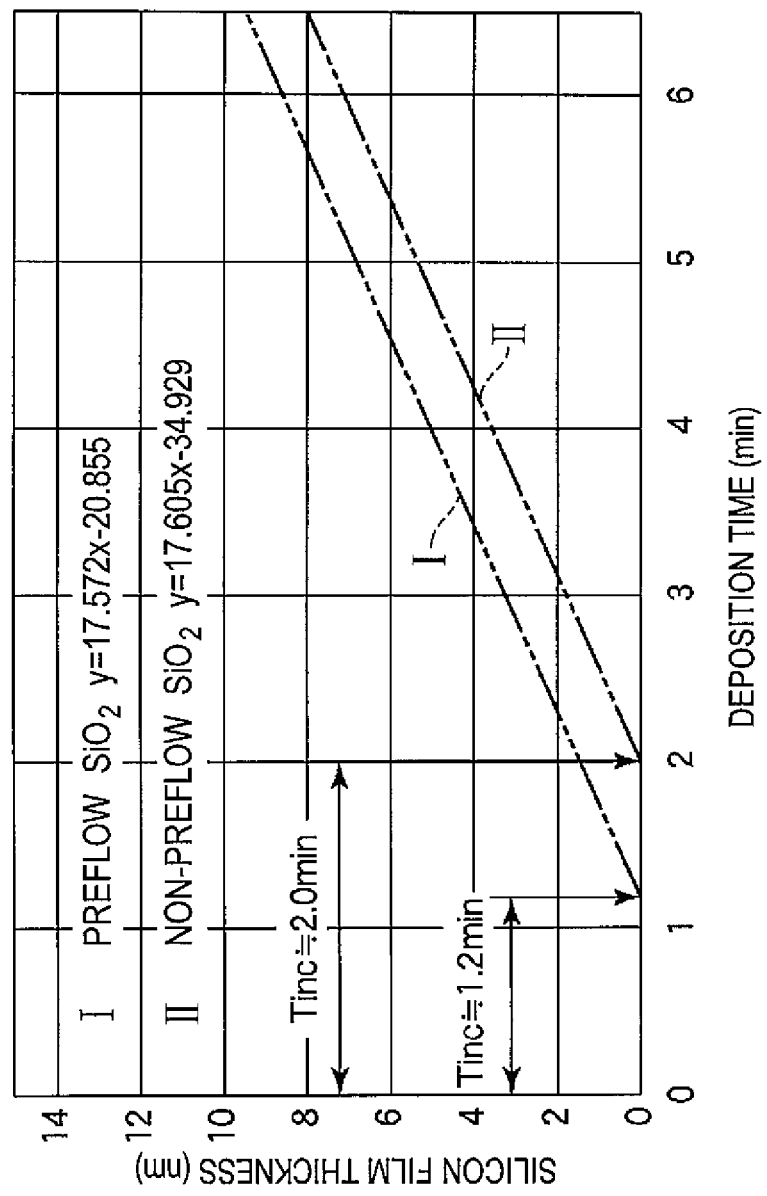

TRENCH-FILLING METHOD AND FILM-FORMING SYSTEM

CROSS-REFERENCE TO RELATED APPLICATIONS

This application claims the benefit of Japanese Patent Application Nos. 2010-170115, filed on Jul. 29, 2010, and 2011-144733, filed on Jun. 29, 2011, with the Japan Patent Office, the disclosure of which is incorporated herein in their entirety by reference.

TECHNICAL FIELD

The present disclosure relates to a method of filling a trench and a system for forming a film.

BACKGROUND

A semiconductor IC (Integrated Circuit) device includes a fine trench structure. A typical example of the fine trench structure is a STI (Shallow Trench Isolation) structure. The STI structure is a device isolation region that isolates active regions of a semiconductor device from each other. The STI structure is formed by forming a fine trench in a silicon substrate and filling the fine trench with a dielectric material.

In the related art, a SOD (Spin-On Dielectric) material is known as an example of the dielectric material that fills the fine trench. In particular, attention is concentrated on an inorganic polymer containing a PHPS (PerHydroPolySilazane: $SiH_2NH$) as the principal ingredient. For example, the PHPS changes into a silicon oxide ($SiO_2$) when being burned in a water-vapor atmosphere. A reaction formula thereof is as follows.

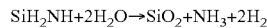

$$SiH_2NH+2H_2O \rightarrow SiO_2+NH_3+2H_2$$

However, the PHPS shrinks when changing into a silicon oxide. Accordingly, voids occur in the fine trench.

Thus, there is known a technique in which a shrinkage amount of the PHPS is first estimated, an expandable film is pre-formed, and then, the PHPS is filled in the fine trench. The expandable film is a silicon (Si) film. According to the technique, the silicon film is changed into a silicon oxide film and expanded, thereby compensating for the shrinkage of the PHPS and suppressing the occurrence of voids in the fine trench.

In the related art, there is also known a process of changing the silicon film into a silicon oxide film, that is, an oxidation process. According to the process, before the forming of the silicon film, an oxidation barrier film, which blocks the passage of oxygen, is formed in the fine trench. This is to prevent the oxidation from reaching the silicon substrate. The oxidation barrier film is a silicon nitride ($Si_3N_4$) film.

However, as the trench becomes finer and finer, it is expected that it will be difficult or impossible to form the oxidation barrier film in addition to the expandable film in the trench.

Also, the oxidation barrier film is left in the trench. If a dielectric material of the oxidation barrier film is different from the dielectric material filling the trench, a band gap difference occurs therebetween. That is, a charge trapping structure is formed in the trench. If charges are trapped in the trench that is a device isolation region, it may obstruct the operation of the semiconductor IC device.

SUMMARY

According to one embodiment of the present disclosure, a method of filling a trench comprises: heating a semiconductor substrate having a trench formed therein and an oxide film formed at least on the sidewall of the trench and supplying an aminosilane gas to the surface of the semiconductor substrate so as to form a seed layer on the semiconductor substrate; heating the semiconductor substrate having the seed layer formed thereon and supplying a monosilane gas to the surface of the seed layer so as to form a silicon film on the seed layer; filling the trench of the semiconductor substrate, which has the silicon film formed thereon, with a filling material that shrinks by burning; and burning the semiconductor substrate coated by the filling material filling the trench in an atmosphere containing water and/or a hydroxy group while changing the filling material into a silicon oxide and changing the silicon film and the seed layer into a silicon oxide.

According to another embodiment of the present disclosure, provided is a system for forming a film used to fill a trench formed in a semiconductor substrate, comprising: a first process chamber configured to heat a semiconductor substrate having a trench formed therein and an oxide film formed at least on the sidewall of the trench and supply an aminosilane gas to the surface of the semiconductor substrate so as to form a seed layer on the semiconductor substrate, and to heat the semiconductor substrate having the seed layer formed thereon and supply a monosilane gas to the surface of the seed layer so as to form a silicon film on the seed layer; a second process chamber configured to fill the trench of the semiconductor substrate, which has the silicon film formed thereon, with a filling material that shrinks by burning; and a third process chamber configured to burn the semiconductor substrate coated by the filling material filling the trench in an atmosphere containing water and/or a hydroxy group while changing the filling material into a silicon oxide and changing the silicon film and the seed layer into a silicon oxide.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 1 is a flow diagram illustrating an example of a sequence of a method of filling a trench according to a first embodiment of the present disclosure.

FIG. 3 is a graph showing the relationship between the deposition time and the thickness of a silicon film.

FIG. 4 is an expanded view of a broken-line frame A in FIG. 3.

DETAILED DESCRIPTION

Figure 2A:
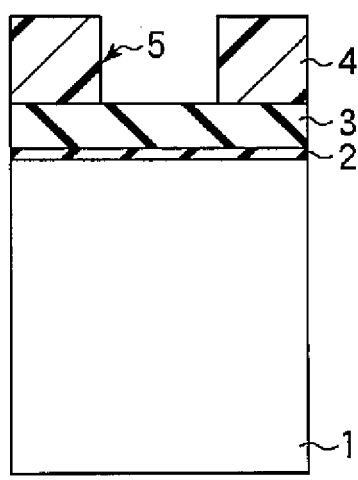
FIGS. 2A to 2G are cross-sectional views showing the states of a semiconductor substrate during the sequence illustrated in FIG. 1.

The inventors of this application repeated an operation to test whether an oxidation barrier film can be removed from the inside of a trench.

A silicon film is an expandable film, and the silicon film is generally formed using a disilane ($Si_2H_6$). The disilane is suitable to form a film on a flat surface. However, the disilane has poor step coverage. Accordingly, a silicon film formed of disilane on the sidewall of a trench is thinner than a silicon film formed on the top surface of a silicon substrate. When the silicon film is oxidized in the condition of oxidizing all of the silicon film formed on the top surface of the silicon substrate, the oxidation progresses from the sidewall of the trench into the silicon substrate. On the other hand, when the silicon film is oxidized in the condition where the oxidation does not progress from the sidewall of the trench into the silicon substrate, an incompletely-oxidized silicon film is left on the top surface of the silicon substrate.

In order to prevent this phenomenon, an oxidation barrier film is formed in the trench to suppress the progress of the oxidation from the sidewall of the trench into the silicon substrate in order to oxidize all of the silicon film formed on the top surface of the silicon substrate.

In order to improve the step coverage of the expandable film (i.e., the silicon film), the inventors changed a silicon raw material from a disilane to a monosilane ($SiH_4$). The silicon film formed of a monosilane had a better step coverage than the silicon film formed of a disilane.

However, the monosilane required a longer incubation time than the disilane. Accordingly, if the film thickness is to be reduced, the film is formed to be island-shaped, failing to become a film.

Hereinafter, exemplary embodiments of the present disclosure will be described in detail with reference to the accompanying drawings. In the drawings, like reference numerals denote like elements.

<First Embodiment>

FIG. 1 is a flow diagram illustrating an example of a sequence of a method of filling a trench according to a first embodiment of the present disclosure. FIGS. 2A to 2G are cross-sectional views showing the states of a semiconductor substrate during the sequence illustrated in FIG. 1.

First, as illustrated in Operation 1 of FIG. 1, a trench is formed in a semiconductor substrate.

An example of forming the trench in the semiconductor substrate is as follows.

As shown in FIG. 2A, the surface of a semiconductor substrate (e.g., a silicon substrate 1 in this embodiment) is thermally oxidized to form a pad oxide film 2. Thereafter, a silicon nitride is deposited on the pad oxide film 2 to form a silicon nitride film 3. Thereafter, a photoresist is coated on the silicon nitride film 3 to form a photoresist film 4. Thereafter, a photolithography process is used to form a window 5 corresponding to a trench-forming pattern in the photoresist film 4.

Figure 2B:
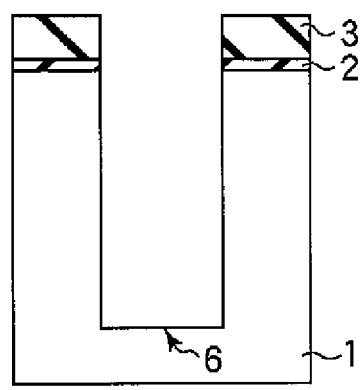

Thereafter, as shown in FIG. 2B, using the photoresist film 4 as a mask, the silicon nitride film 3, the pad oxide film 2, and the silicon substrate 1 are anisotropically etched (e.g., reactive-ion-etched) to form a trench 6 in the silicon substrate 1.

Thereafter, as illustrated in Operation 2 of FIG. 1, an oxide film is formed on the surface of the semiconductor substrate.

Figure 2C:
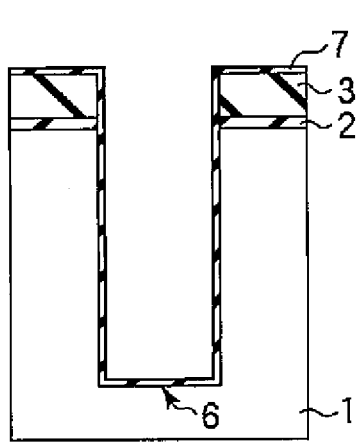

In this process, a film, which is more difficult than the silicon substrate 1 to oxidize, is formed on the surface of the silicon substrate 1 exposed at least at the sidewall of the trench 6. FIG. 2C shows an embodiment of such process. In FIG. 2C, an oxide film 7 is formed on the surface of the silicon nitride film 3, on the surface of the pad oxide film 2, and on the surface of the silicon substrate 1 exposed at the trench 6. However, the present disclosure is not limited to the example shown in FIG. 2C. For example, the oxide film 7 may be formed only on the sidewall of the trench 6, or only on the surface of the exposed silicon substrate 1. Also, the oxide film 7 may be formed on the region including the surface of the exposed silicon substrate 1. The oxide film 7 is a silicon oxide. The silicon oxide film is more difficult to oxidize than the silicon film.

Also, in this embodiment, a radical oxidation process is used to form the oxide film 7. According to the radical oxidation process, not only the surface of the silicon substrate 1 exposed at the inside of the trench 6 but also the surface of the pad oxide film 2 or the surface of the silicon nitride film 3 can be oxidized as shown in FIG. 2C. That is, the entire surface on the trench-formed side of the silicon substrate 1 may be oxidized so that the oxide film 7 may be formed on the entire surface on the trench-formed side of the silicon substrate 1. When the oxide film 7 is formed on the entire surface on the trench-formed side of the silicon substrate 1, a subsequent seed layer may be formed on the oxide film 7. When the seed layer is formed on both the nitride film and the oxide film, the growth rate of a silicon film formed after the seed layer may have a difference between when formed on the nitride film and on the oxide film. In this context, when the seed layer is formed on the oxide film 7, the growth rate difference of the silicon film can be reduced, thus assisting in improving the step coverage.

Figure 2D:
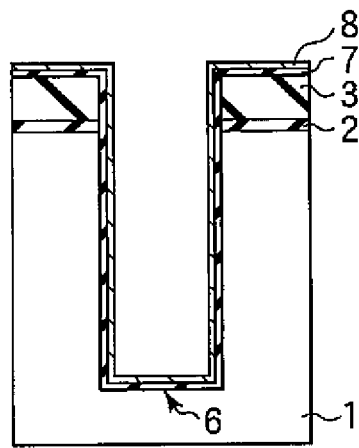

Thereafter, as illustrated in Operation 3 of FIG. 1 and shown in FIG. 2D, a seed layer 8 is formed on the oxide film 7. Specifically, the silicon substrate 1 having the oxide film 7 formed thereon is heated and an aminosilane gas is flowed to the surface of the heated silicon substrate 1, thereby forming the seed layer 8 on the surface of the silicon substrate 1 (e.g., on the surface of the oxide film 7 in this embodiment).

Examples of the aminosilane gas are butylaminosilane (BAS), bistertiarybutylaminosilane (BTBAS), dimethylaminosilane (DMAS), bisdimethylaminosilane (BDMAS), tridimethylaminosilane (TDMAS), diethylaminosilane (DEAS), bisdiethylaminosilane (BDEAS), dipropylaminosilane (DPAS), and diisopropylaminosilane (DIPAS). In this embodiment, DIPAS is used as the aminosilane gas.

An example of the process conditions in Operation 3 is as follows:
 DIPAS Flow Rate: 500 sccm
 Process Time: 1 min
 Process Temperature: 400° C.
 Process Pressure: 53.3 Pa (0.4 Torr)

Hereinafter, the process of Operation 3 will be referred to as a preflow.

Operation 3 is a process of facilitating the adsorption of a monosilane to the oxide film. Although the seed layer 8 is described as being formed in Operation 3, it is scarcely formed in actuality. Preferably, the thickness of the seed layer 8 may be equal to about the thickness of a monoatomic layer level. For example, the thickness of the seed layer 8 may be 0.1 nm to 0.3 nm.

Figure 2E:
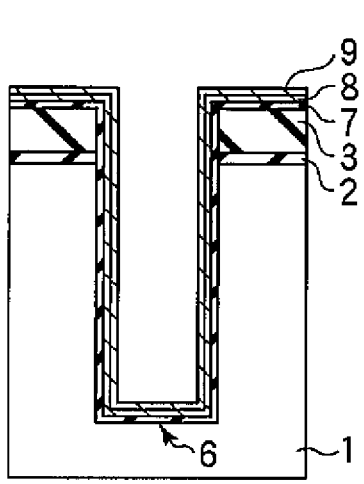

Thereafter, as illustrated in Operation 4 of FIG. 1 and shown in FIG. 2E, a silicon film 9 is formed on the seed layer 8. Specifically, the silicon substrate 1 having the seed layer 8 formed thereon is heated and a monosilane gas is flowed to the surface of the heated silicon substrate 1, thereby forming the silicon film 9 on the surface of the silicon substrate 1 (e.g., on the surface of the seed layer 8 in this embodiment).

An example of the process conditions in Operation 4 is as follows:
 Monosilane Flow Rate: 800 sccm
 Process Time: 4 min
 Process Temperature: 535° C.
 Process Pressure: 60 Pa (0.45 Torr)

Under the conditions of the monosilane flow rate, the process temperature and the process pressure, a thin amorphous silicon film 9 with a thickness of about 2 nm to about 10 nm is formed in a process time (a deposition time) of about 3 min to about 6 min. The thickness of the silicon film 9 plays an important role for compensating for a shrinkage amount of a subsequently-formed filling material. Although the compensation amount is determined by the sum of the thickness of the seed layer 8 and the thickness of the silicon film 9, the seed layer 8 is to facilitate the adsorption of a monosilane and, as mentioned above, the seed layer 8 is considerably thinner than the silicon film 9. Accordingly, the thickness of the silicon film 9 after the expansion thereof occupies most of the compensation amount. That is, the compensation amount is determined mostly by the thickness of the silicon film 9.

Figure 2F:
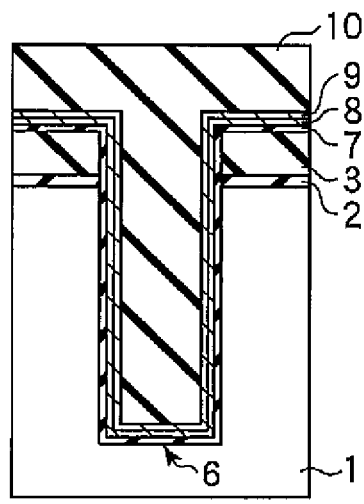

Thereafter, as illustrated in Operation 5 of FIG. 1 and shown in FIG. 2F, the trench 6 is filled with a filling material 10 that shrinks by burning. Specifically, the surface of the silicon substrate 1 having the silicon film 9 formed thereon is spin-coated with a liquid filling material 10, which changes into a silicon oxide by burning, to fill the trench 6.

An example of the filling material that changes into a silicon oxide by burning is an inorganic polymer containing a PHPS (PerHydroPolySilazane: $SiH_2NH$) as the principal ingredient.

Figure 2G:
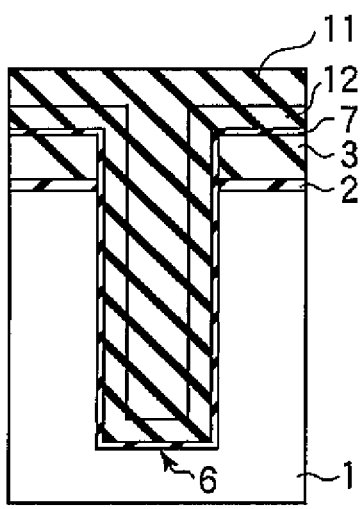

Lastly, as illustrated in Operation 6 of FIG. 1 and shown in FIG. 2G, the filling material 10 filling the trench 6 is burned in an atmosphere containing water and/or a hydroxy group while the silicon film 9 and the seed layer 8 are changed into a silicon oxide 12. Specifically, the silicon substrate 1 coated with the filling material 10 is burned in an atmosphere containing water and/or a hydroxy group, thereby changing the filling material 10 into a silicon oxide 11 and changing the silicon film 9 and the seed layer 8 into a silicon oxide 12.

An example of the process conditions in Operation 6 is as follows:
 $H_2O$ Flow Rate: 10l/min
 Process Time: 45 min
 Process Temperature: 750° C.
 Process Pressure: 53.3 kPa (400 Torr)

Also, after the burning process, it may be heat-treated at a process temperature of 950° C. in an inert gas atmosphere, for example, in a nitrogen gas atmosphere, and may be again burned to change the silicon oxide 11 into a harder filling film.

Also, before the burning process, it may be preliminarily processed at a lower temperature of 400° C. in an atmosphere containing water and/or a hydroxy group, for example, in a vapor atmosphere.

The filling material 10 shrinks when changing into the silicon oxide 11 by burning. On the other hand, the silicon film 9 and the seed layer 8 expand when changing into the silicon oxide 12. In this manner, the shrinkage amount of the filling material 10 is compensated for by the expansion amount of the silicon film 9 and the seed layer 8, thereby suppressing the occurrence of voids in the trench 6.

In order to better suppress the occurrence of voids in the trench 6, the thickness of the silicon film 9 and the thickness of the seed layer 8 may be set such that the sum of double of the expansion amount of the silicon film 9 and double of the expansion amount of the seed layer 8 is equal to the shrinkage amount of the filling material 10.

Also, the sum of double of the thickness of the oxide film 7, double of the thickness of the silicon film 9 after the expansion thereof, double of the thickness of the seed layer 8 after the expansion thereof, and the thickness of the filling material 10 after the shrinkage thereof may be set to be equal to the width of the trench 6.

These settings can better suppress the occurrence of voids in the trench 6.

Also, both the silicon film 9 and the seed layer 8 are oxidized in Operation 6. Accordingly, the burning time in Operation 6 may be set to accurately and completely oxidize the silicon film 9 and the seed layer 8.

This setting can suppress the progress of oxidation from the sidewall of the trench 6 to the silicon substrate 1.

In this embodiment, a monosilane is used as a raw material for the silicon film 9. Accordingly, the step coverage of the silicon film 9 may be compared with that of where a high-order silane such as a disilane or a trisilane is used as a raw material for the silicon film 9.

The thickness of the silicon film 9 on the sidewall of the trench 6 can be almost equal to the thickness of the silicon film 9 on the top surface of the silicon substrate 1. Accordingly, the silicon film 9 on the top surface of the silicon substrate 1 can be completely oxidized at the time when the silicon film 9 on the sidewall of the trench 6 is completely oxidized.

That is, the step coverage of the silicon film 9 is improved to prevent the progress of oxidation from the sidewall of the trench 6 to the silicon substrate 1, thus making it possible to remove an oxidation barrier from the inside of the trench 6.

However, under some oxidation conditions, it is difficult to perform oxidation at the bottom of the trench 6 even when the step coverage of the silicon film 9 is improved. In this case, Operation 6 may be executed for a time period that is somewhat longer than a time period taken to accurately and completely oxidize the silicon film 9 and the seed layer 8 on the top surface of the silicon substrate 1 and the sidewall of the trench 6. When the silicon film 9 and the seed layer 8 are excessively oxidized for a time period that is somewhat longer than the complete oxidation time period, the silicon film 9 and the seed layer 8 are not left unoxidized at the bottom of the trench 6.

In this case, as the thickness of the silicon film 9 is decreased, the excessive oxidation time can be decreased, that is, the oxidation condition can be weakened. Accordingly, it is preferable to decrease the thickness of the silicon film 9. This is to suppress the progress of oxidation to the silicon substrate 1 to a minimum.

When the silicon film 9 and the seed layer 8 are excessively oxidized, the desirable thickness of the silicon film 9 is 2 nm to 5 nm, in order to prevent the silicon film 9 and the seed layer 8 from being left unoxidized at the bottom of the trench.

Also, the problem of a long incubation time of the monosilane is solved by preflowing an aminosilane gas to the surface of the silicon substrate 1 (e.g., to the surface of the oxide film 7 in this embodiment), forming the seed layer 8 thereon and then forming the silicon film 9 thereon.

FIG. 3 is a graph showing the relationship between the deposition time and the thickness of the silicon film 9. The results illustrated in FIG. 3 correspond to a case where the underlayer is a silicon oxide ($SiO_2$) film. In this embodiment, it corresponds to the oxide film 7.

The process conditions in the preflow used in this embodiment are as follows:
DIPAS Flow Rate: 200 sccm
Process Time: 1 min
Process Temperature: 400° C.
Process Pressure: 133.3 Pa (1 Torr)

Likewise, the process conditions for forming the silicon film 9 used in this embodiment are as follows:
Monosilane Flow Rate: 200 sccm
Deposition Time: 30 min/45 min/60 min
Process Temperature: 530° C.
Process Pressure: 53.2 Pa (0.4 Torr)

The thickness of the silicon film 9 was measured at three points when the deposition time was 30 min, 45 min, and 60 min.

Line I of FIG. 3 represents the results when there is a preflow, and line II of FIG. 3 represents the results when there is no preflow. Lines I and II are straight lines that are obtained by linearly approximating the three measured film thicknesses, and Equations thereof are as follows:

$$\text{Line I:} y=17.572x-20.855 \tag{1}$$

$$\text{Line II:} y=17.605x-34.929 \tag{2}$$

As shown in FIG. 3, it is obvious that the thickness of the silicon film 9 is greater when there is a preflow than when there is no preflow.

FIG. 4 is an expanded view of a broken-line frame A in FIG. 3. FIG. 4 shows intersections where lines I and II meet the deposition time axis, respectively. The intersections are obtained when y=0 in Equation (1) and (2), that is, when the thickness of the silicon film 9 is "0."

As shown in FIG. 4, when the underlayer is a silicon oxide film and there is a preflow, the deposition of the silicon film 9 starts at about 1.2 min (x≈1.189) from the initiation of the process. On the other hand, when the underlayer is a silicon oxide film and there is no preflow, the deposition of the silicon film 9 starts at about 2.0 min (x≈1.984) from the initiation of the process.

In this manner, the incubation time can be reduced from about 2.0 min to about 1.2 min by forming a seed layer through preflowing an aminosilane gas to the underlayer. Consequently, the silicon film 9 with a small thickness of, for example, about 2 nm to about 10 nm, can be formed using a monosilane.

As described above, according to the first embodiment of the present disclosure, the occurrence of voids in the filling materials (the silicon oxides 11 and 12) filling the trench 6 can be suppressed even when an oxidation barrier film is not formed in the trench 6.

Therefore, according to the first embodiment, it is possible to fill the trench 6 without the occurrence of voids in the trench 6 even when the trench 6 is further miniaturized.

Also, according to the first embodiment, all the material filling the trench 6, including the oxide film 7, becomes a silicon oxide. This structure is advantageous, for example, in that a charge trapping structure is not formed in the trench 6 because the trench 6 is filled with one type of material. This structure is also advantageous for the further miniaturization of semiconductor IC devices.

Also, according to the first embodiment, the oxide film 7 is a radical oxide film formed by a radical oxidation process. The radical oxide film can have a denser film quality than a thermal oxide film formed by a thermal oxidation process. That is, the radical oxide film is more difficult than the thermal oxide film to oxidize. Thus, the progress of the oxidation to the silicon substrate 1 in the burning process of Operation 6 can be suppressed better when the oxide film 7 is a radical oxide film, than when the oxide film 7 is a thermal oxide film.

Also, the same advantage can be obtained, when the oxide film 7 is a plasma oxide film formed by a plasma oxidation process instead of a radical oxidation process.

An example of a film forming apparatus capable of forming the seed layer 8 and the silicon film 9 will be described below in detail.

Figure 5:
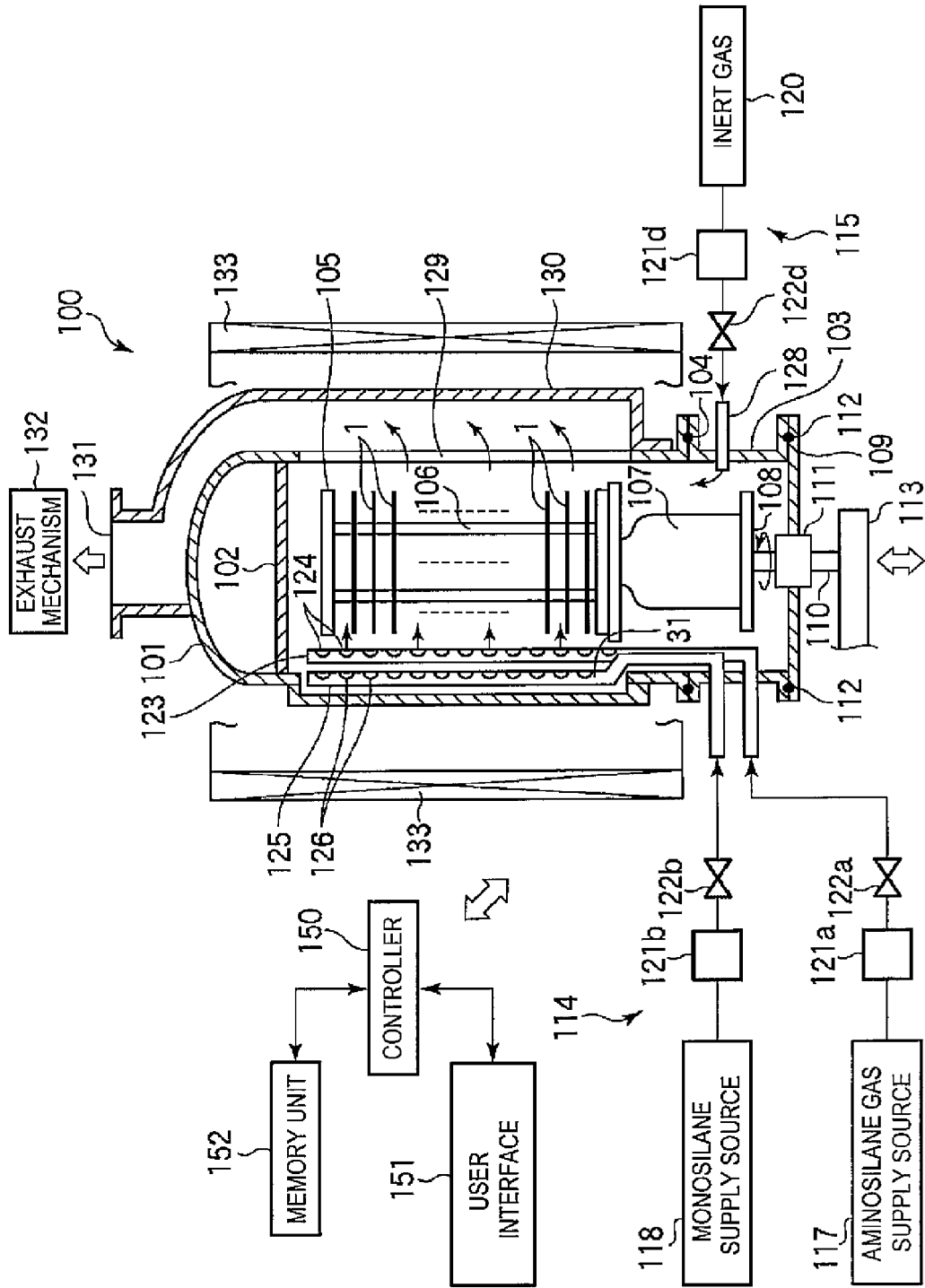
FIG. 5 is a cross-sectional view showing an example of a film-forming apparatus for forming a seed layer and a silicon film.

FIG. 5 is a schematic cross-sectional view showing an example of a film-forming apparatus for forming the seed layer 8 and the silicon film 9.

As shown in FIG. 5, a film-forming apparatus 100 includes a cylindrical process chamber 101 having a ceiling with a bottom end opened. The entire process chamber 101 is formed of, for example, quartz. A quartz ceiling plate 102 is installed at the ceiling in the process chamber 101. A manifold 103 formed of, for example, a stainless steel in a cylindrical shape is connected to a bottom opening of the process chamber 101 through a seal member such as an O ring.

The manifold 103 supports the bottom end of the process chamber 101. A quartz wafer boat 105, which can mount a plurality of process targets such as 50 to 100 semiconductor substrates (e.g., silicon substrate 1 in this embodiment) in a multistage structure, is configured such that it can be inserted from the bottom of the manifold 103 into the process chamber 101. Accordingly, a process target such as a semiconductor substrate, for example, a silicon substrate 1 in this embodiment, on which a $SiO_2$ film is deposited as an underlayer, is introduced into the process chamber 101. The wafer boat 105 has a plurality of support pillars 106, and the silicon substrates 1 is supported by a groove formed by the support pillars 106.

The wafer boat 105 is mounted on a table 108 through a quartz heat insulation tube 107. The table 108 is supported on a rotary shaft 110 that pierces a cover 109 that is formed of, for example, a stainless steel to open/close a bottom opening of the manifold 103. For example, a magnetic fluid seal 111 is installed at a piercing portion of the rotary shaft 110 to seal the rotary shaft 110 tightly and support the rotary shaft 110 rotatably. A seal member 112 formed of, for example, an O ring, is installed between a peripheral portion of the cover 109 and a bottom end of the manifold 103. Accordingly, the sealing state in the process chamber 101 is maintained. The rotary shaft 110 is installed at a front end of an arm 113 supported by an elevating mechanism (not shown) such as a boat elevator. Accordingly, the wafer boat 105 and the cover 109 are elevated in an integrated manner to be inserted into/separated from the process chamber 101.

The film-forming apparatus 100 includes a process gas supply mechanism 114 for supplying a process gas into the process chamber 101.

The process gas supply mechanism 114 includes an aminosilane gas supply source 117 and a monosilane gas supply source 118.

The inert gas supply mechanism 115 includes an inert supply source 120. The inert gas is used as a purge gas, etc. An example of the inert gas is $N_2$ gas.

The aminosilane gas supply source 117 is connected to a dispersing nozzle 123 through a flow controller 121a and an on-off valve 122a. The dispersing nozzle 123 includes a quartz tube. The dispersing nozzle 123 pierces the sidewall of the manifold 103 inward, bends upward, and extends vertically. At a vertical portion of the dispersing nozzle 123, a plurality of gas discharge holes 124 are formed spaced apart from each other by a predetermined distance. The aminosilane gas is approximately uniformly discharged from the respective gas discharge holes 124 into the process chamber 101 in a horizontal direction.

The monosilane gas supply source 118 is connected to a dispersing nozzle 125 through a flow controller 121b and an on-off valve 122b. The dispersing nozzle 125 includes a quartz tube. The dispersing nozzle 125 pierces the sidewall of the manifold 103 inward, bends upward, and extends vertically. At a vertical portion of the dispersing nozzle 125, a plurality of gas discharge holes 126 are formed spaced apart from each other by a predetermined distance. The monosilane gas is approximately uniformly discharged from the respective gas discharge holes 126 into the process chamber 101 in the horizontal direction.

At a portion opposite to the dispersing nozzles 123 and 125 in the process chamber 101, an exhaust vent 129 is installed to exhaust the process chamber 101. The exhaust vent 129 has an elongated shape formed by chipping the sidewall of the process chamber 101 in the vertical direction. At a portion corresponding to the exhaust vent 129 of the process chamber 101, an exhaust vent cover member 130 with a C-shaped section is installed by welding to cover the exhaust vent 129. The exhaust vent cover member 130 extends upward along the sidewall of the process chamber 101, and defines a gas outlet 131 at the top of the process chamber 101. An exhaust mechanism 132 including a vacuum pump is connected to the gas outlet 131. The exhaust mechanism 132 exhausts the process chamber 101 to discharge the process gas used for the process and to change the pressure in the process chamber 101 into the process pressure.

A cylindrical body-shaped heating device 133 is installed on the outer periphery of the process chamber 101. The heating device 133 activates a gas supplied into the process chamber 101, and heats a process target such as a semiconductor substrate (e.g., a silicon substrate 1 in this embodiment) loaded in the process chamber 101.

For example, the components of the film-forming apparatus 100 are controlled by a controller 150 including a microprocessor (e.g., a computer). The controller 150 is connected to a user interface 151 including a keyboard for inputting, by an operator, a command to control the film-forming apparatus 100, and a display unit for displaying an operation state of the film-forming apparatus 100.

A memory unit 152 is connected to the controller 150. The memory unit 152 stores a control program for executing various processes in the film-forming apparatus 100 under the control of the controller 150, and a program (i.e., a recipe) for executing a process in each component of the film-forming apparatus 100 according to the process conditions. For example, the recipe is stored in a memory medium of the memory unit 152. The memory medium may include a hard disk, a semiconductor memory, a CD-ROM, a DVD, and a portable memory such as a flash memory. The recipe may be suitably transmitted from other device through a dedicated line. If necessary, the recipe is read from the memory unit 152 in response to a command received from the user interface 151, and the controller 150 executes a process according to the read recipe. Accordingly, the film-forming apparatus 100 performs a desired process under the control of the controller 150.

In the first embodiment, the processes of forming the seed layer 8 and the silicon film 9 are sequentially executed under the control of the controller 150.

In the first embodiment, the seed layer 8 and the silicon film 9 may be formed by one film-forming apparatus by using the film-forming apparatus 100 shown in FIG. 5.

Also, the film-forming apparatus is not limited to a batch-type film-forming apparatus shown in FIG. 5, but may be a single-type film-forming apparatus.

<Second Embodiment>

According to the process conditions for forming the seed layer 8 and the silicon film 9, the seed layer 8 and the silicon film 9 which discharge a gas may be formed in the burning process for the filling material 10. When the seed layer 8 and the silicon film 9 discharge a gas in the burning process for the filling material 10, voids occur in the filling material filling the trench 6.

The second embodiment provides a method of filling a trench that can suppress the occurrence of voids in the filling material filling the trench 6, even when the seed layer 8 and the silicon film 9 which discharge a gas are formed.

Figure 6:
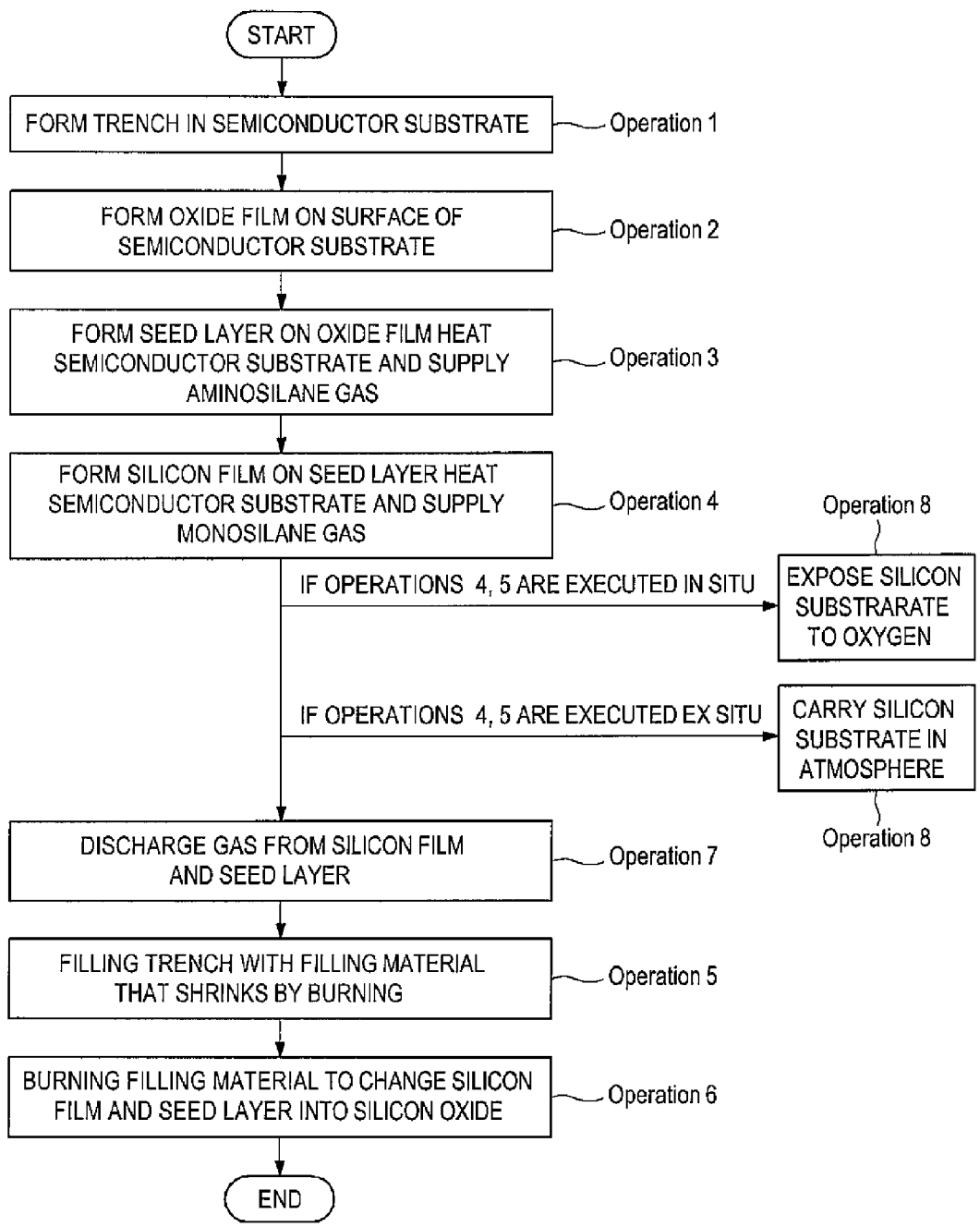
FIG. 6 is a flow diagram illustrating an example of a sequence of a method of filling a trench according to a second embodiment of the present disclosure.

FIG. 6 is a flow diagram illustrating an example of a sequence of a method of filling a trench according to a second embodiment of the present disclosure.

As illustrated in FIG. 6, the method of filling a trench according to the second embodiment is different from the method of filling a trench according to the first embodiment in that it includes a process of discharging a gas from the silicon film 9 and the seed layer 8 as illustrated in Operation 7 between Operations 4 and 5. Specifically, the silicon substrate 1 having the silicon film 9 and the seed layer 8 formed thereon is heated to discharge a gas from the silicon film 9 and the seed layer 8.

An example of the process conditions in Operation 7 is as follows:

$N_2$ Flow Rate: 5000 sccm
Process Time: 30 min
Process Temperature: 600° C.
Process Pressure: 0 to 666 Pa (0 to 5 Torr: Cycle Purge)

When the process pressure is 0 Pa among 0 to 666 Pa, the process chamber is completely exhausted of nitrogen gas. That is, an example of Operation 7 is an example of alternately repeating the supply of a nitrogen gas into the process chamber and the exhaust of a nitrogen gas from the process chamber (a cycle purge).

In this manner, the gas is discharged from the silicon film 9 and the seed layer 8 before the coating of the filling material 10, thereby making it possible to suppress the discharge of the gas from the seed layer 8 and the silicon film 9 in the burning process for the filling material 10.

Thus, the occurrence of voids in the filling material filling the trench 6 can be suppressed even if the seed layer 8 and the silicon film 9 which discharge a gas are formed.

Also, conducting the cycle purge with varied pressures or conducting it with varied temperatures at the same time may cause migration to the silicon film 9. Therefore, a natural oxide film may be formed beforehand on the surface of the silicon film 9.

As shown in FIG. 6, in order to form a natural oxide film on the surface of the silicon film 9, if Operation 4 and Operation 5 are executed in situ, the silicon substrate 1 having the silicon film 9 and the seed layer 8 formed thereon may be exposed to oxygen as Operation 8 between Operation 4 and Operation 7.

Also, if Operation 4 and Operation 5 are executed ex situ, the silicon substrate 1 having the silicon film 9 and the seed layer 8 formed thereon may be carried from the film-forming apparatus for performing Operation 4 to the spin-coating apparatus for performing Operation 7, in an air atmosphere as Operation 8 between Operation 4 and Operation 7.

In this manner, a natural oxide film is formed beforehand on the surface of the silicon film 9, thereby making it possible to suppress the migration in the silicon film 9 during the discharge of a gas in Operation 7.

<Third Embodiment>

The third embodiment is an example of forming a thinner silicon film 9 while maintaining good step coverage.

The seed layer 8 generates the nucleus of silicon uniformly at the underlayer at which a silicon film 9 is formed, for example, the surface of the oxide film 7, thus facilitating the adsorption of a monosilane. From the microscopic perspective, the nucleus of the silicon of the seed layer 8 may have been scattered uniformly in an island shape, and the flat size of the nucleus itself may be very small. Based on this perspective, if the seed layer 8 is changed from an island shape to a flat single layer by increasing the surface area occupied by the nucleus on the surface of the underlayer through the increased flat size of the nucleus itself, or if the growth of the silicon film 9 is changed from "nucleus growth" to "single layer growth" by using a seed layer 8 of the flat single layer, it is possible to form a thinner silicon film 9 at the seed layer 8 while maintaining good step coverage.

Considering this, in the third embodiment, the seed layer 8 is strengthened before forming a silicon film 9. An example of strengthening the seed layer 8 is to increase the surface area occupied by the nucleus on the surface of the underlayer by increasing the flat size of the nucleus of the silicon in the seed layer 8. As described above, the seed layer 8 may be a flat single layer. Further, in order to strengthen the seed layer 8, before forming a silicon film 9 using monosilane, silicon may be adsorbed thinly on the surface of the seed layer 8 using a higher order silane suitable for forming a thin film than the monosilane.

The following describes an example of filling the trench according to the third embodiment.

Figure 7:
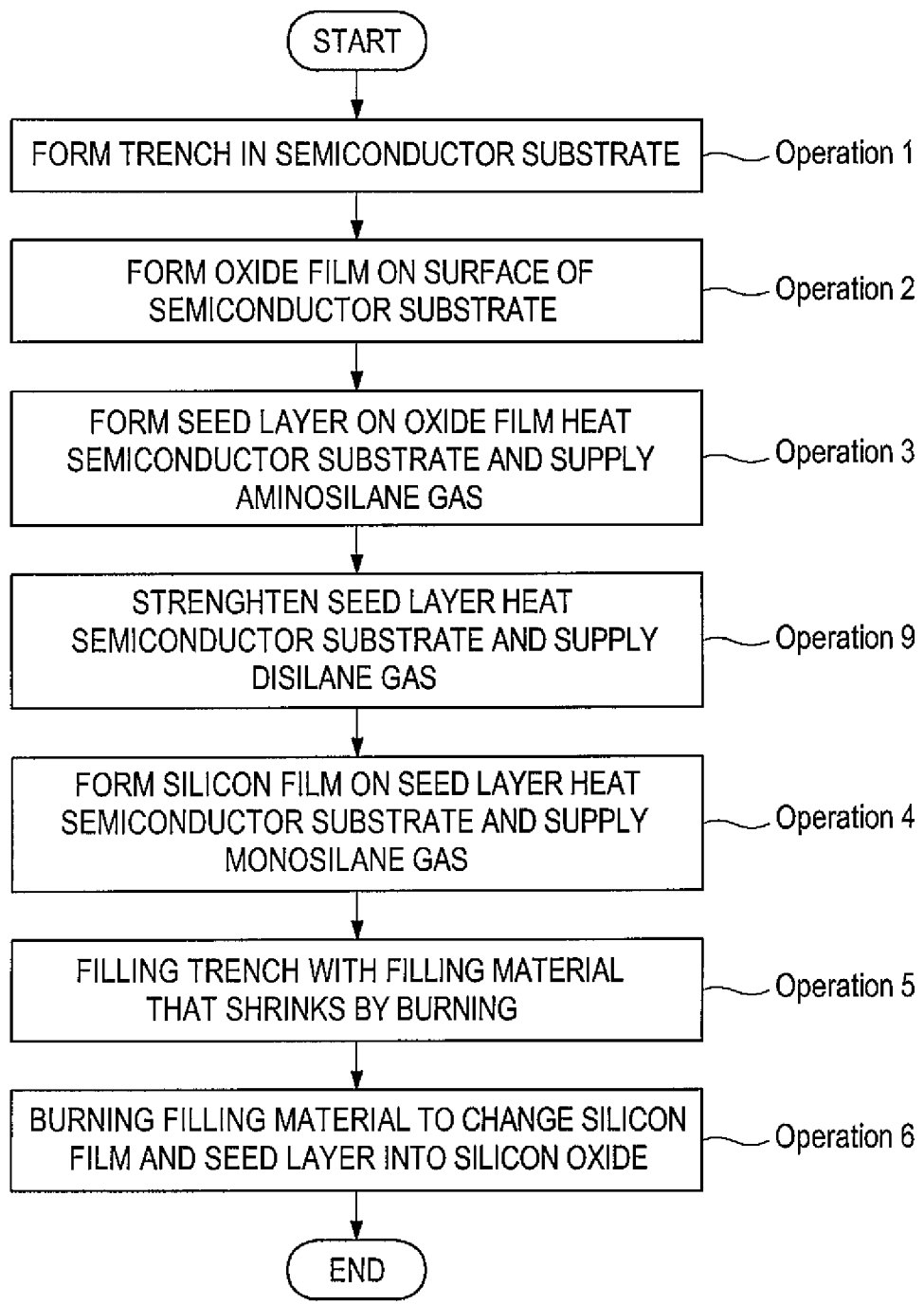
FIG. 7 is a flow diagram illustrating an example of a sequence of a method of filling a trench according to a third embodiment of the present disclosure.

FIG. 7 is a flow diagram illustrating an example of a sequence of a method of filling a trench according to the third embodiment of the present disclosure.

As shown in FIG. 7, the trench-filling method according to the third embodiment differs from the trench-filling method according to the first embodiment in that Operation 9, which strengthens the seed layer 8, exists between Operations 3 and 4. More specifically, Operation 9 may be executed by heating the silicon substrate 1, on which the seed layer 8 is formed, and supplying a higher order silane (e.g., disilane ($Si_2H_6$) gas in this example) than monosilane.

An example of the process conditions in Operation 9,
Disilane Flow Rate: 200 sccm
Process Time: 2 min
Process Temperature: 400° C.
Process Pressure: 133.3 Pa (1 Torr)

Figure 8:
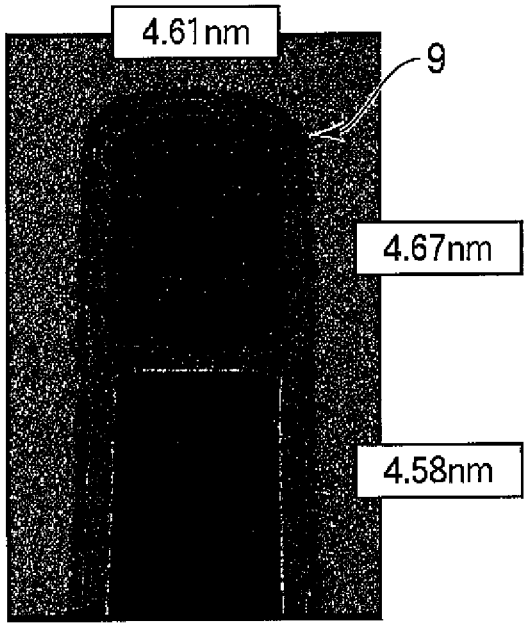
FIG. 8 is a cross-sectional picture showing the inside structure of a semiconductor device having a silicon film 9, which is formed according to the first embodiment of the present disclosure.
Figure 9:
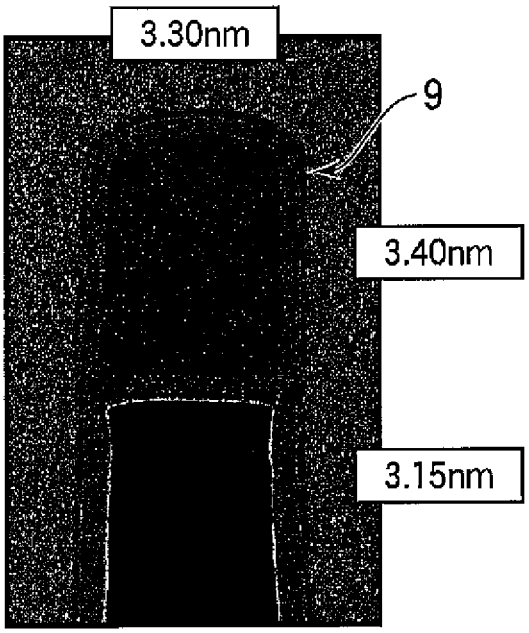
FIG. 9 is a cross-sectional picture showing the inside structure of a semiconductor device having a silicon film 9, which is formed according to the third embodiment of the present disclosure.

FIG. 8 is a cross-sectional picture (SEM picture) showing the inside structure of a semiconductor device having a silicon film 9, which is formed according to the first embodiment of the present disclosure. FIG. 9 is a cross-sectional picture (SEM picture) showing the inside structure of a semiconductor device having a silicon film 9, which is formed according to the third embodiment of the present disclosure.

As shown in FIG. 8, in the first embodiment, the silicon film 9 having the side film thickness of 4.58 nm~4.67 nm and the top film thickness of 4.61 nm was formed in coverage (step coverage) of 99% to 101%. As for coverage, the two side film thicknesses (upper and lower) and the top film thickness of the silicon film 9 are shown in FIG. 8, and is same as in FIGS. 9 to 11.

In addition, as shown in FIG. 9, in the third embodiment, the silicon film 9 having the side film thickness of 3.15 nm~3.40 nm and the top film thickness of 3.30 nm was formed in coverage (step coverage) of 95% to 103%.

According to the third embodiment, before forming the silicon film 9 using a monosilane, the silicon is absorbed thinly on the surface of the seed layer 8 by using a higher order silane than monosilane, thereby achieving a thinner silicon film 9 having good step coverage.

Figure 10:
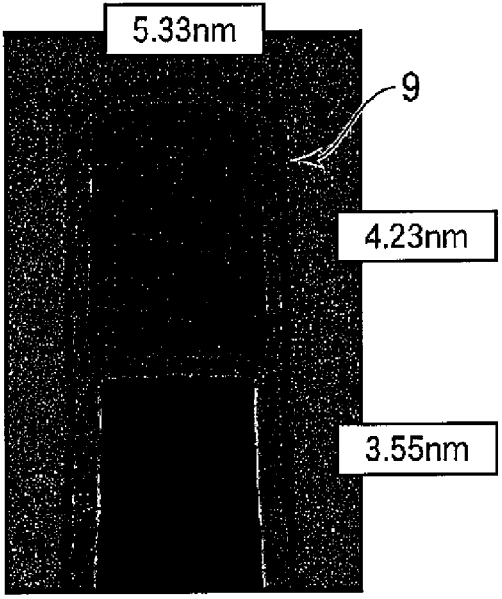
FIG. 10 is a cross-sectional picture showing the inside structure of a semiconductor device having a silicon film 9, which is formed by using only disilane gas.
Figure 11:
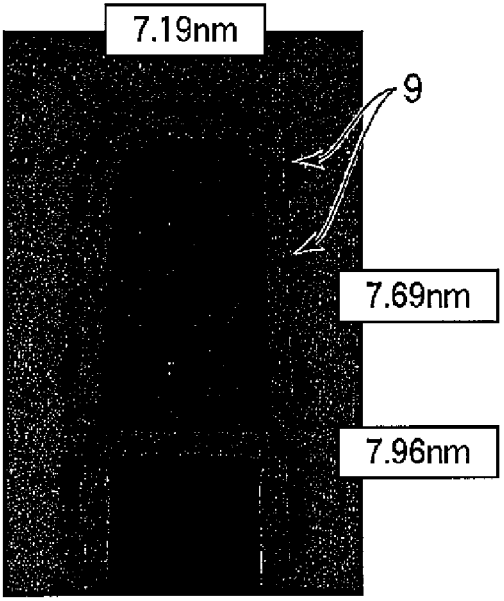
FIG. 11 is a cross-sectional picture showing the inside structure of a semiconductor device having a silicon film 9, which is formed by using only silane gas.

Further, for reference, FIG. 10 is a cross-sectional picture (SEM picture) showing the inside structure of a semiconductor device having a silicon film 9, which is formed by using only disilane gas, and FIG. 11 is a cross-sectional picture (SEM picture) showing the inside structure of a semiconductor device having a silicon film 9, which is formed by using only silane gas.

As shown in FIG. 10, when only the disilane gas is used, it is possible to form a silicon film 9 having the side film thickness of 3.55 nm~4.23 nm and the top film thickness of 5.33 nm; however, a good step coverage (step coverage: 67% to 79%) cannot be obtained.

Also, as shown in FIG. 11, when only the silane gas is used, it is possible to obtain a good step coverage of 106% to 110%; however, the silicon film 9 is formed in an island shape and a single layer cannot be obtained in the thickness range of 7.19 nm~7.96 nm.

The first and third embodiments of the present disclosure may be differently used according to the required thickness of silicon film 9. For example, if a silicon film 9 is required to be thin to some extent, however, not too thin, the first embodiment is more cost effective than the third embodiment since only the monosilane is used in the first embodiment without using both of a higher order silane and a monosilane. However, if a silicon film 9 is required to be very thin to the extent that it cannot be obtained from the first embodiment, it is preferable to choose the third embodiment. As such, the first and third embodiments can coexist with each other in the field of manufacturing semiconductor devices.

Figure 12:
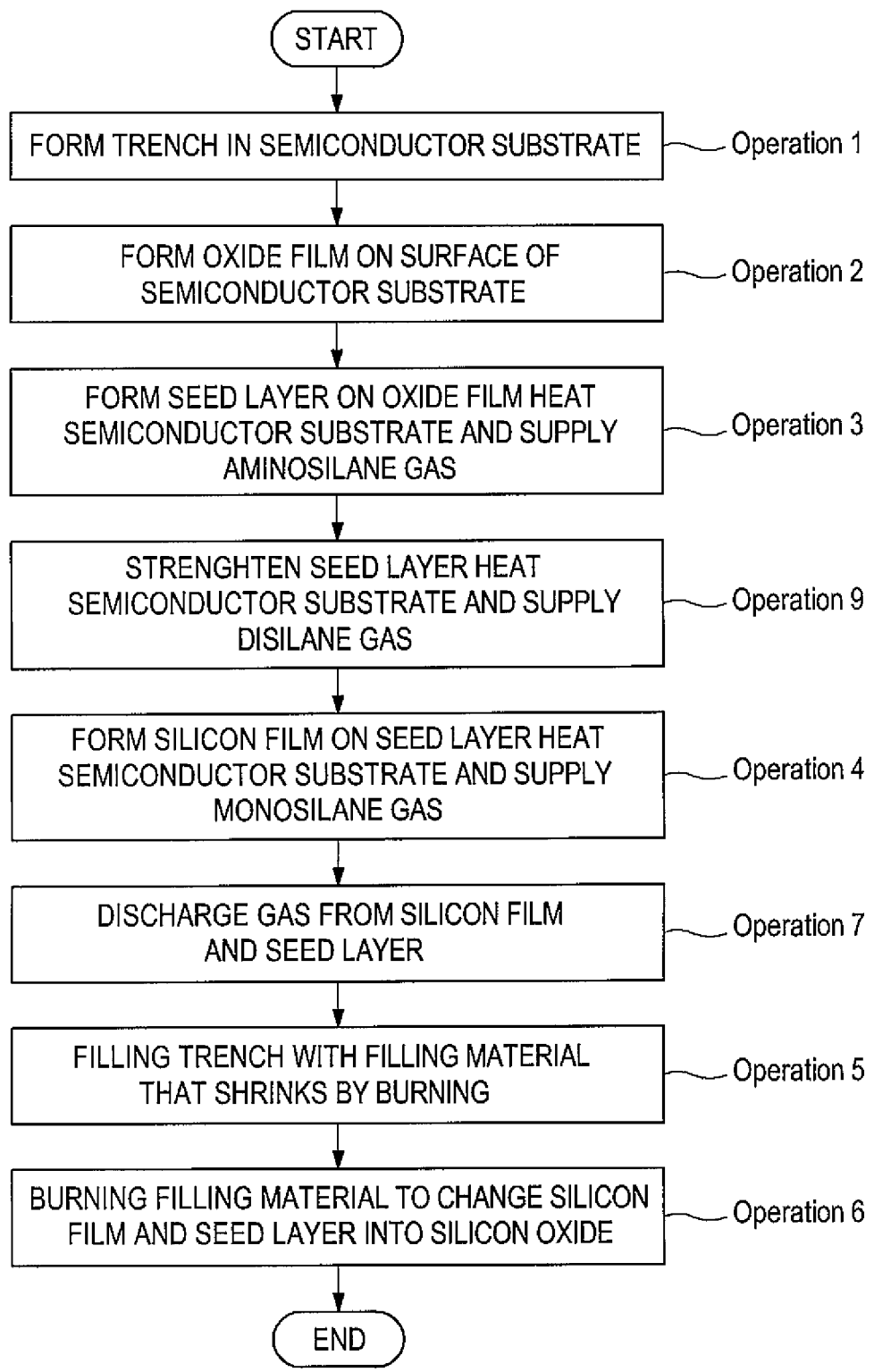
FIG. 12 is a flow diagram illustrating another example of a sequence of a method of filling a trench according to a third embodiment of the present disclosure.

In addition, as shown in the flow diagram of FIG. 12, as another example of the third embodiment, it is also possible to implement a combination of the second embodiment and the third embodiment.

As shown in FIG. 12, even when the second embodiment and the third embodiment are combined, it is preferable that Operation 8 to strengthen the seed layer 8 is inserted between Operation 3 and Operation 4.

Further, as the film-forming apparatus for forming a seed layer 8 and a silicon film 9 according to the third embodiment, it is preferable to add a higher order silane gas (e.g., disilane gas) supply source to the film-forming apparatus as shown in FIG. 5. In particular, although it is not shown, the disilane gas supply source, for example, may be connected to a dispersing nozzle 125, together with monosilane gas supply source 118, thereby supplying the disilane gas into the processing chamber 101.

Fourth Embodiment

The Fourth embodiment relates to an exemplary system for forming a film that can perform the trench-filling methods according to the first to third embodiments.

First Example

Figure 13:
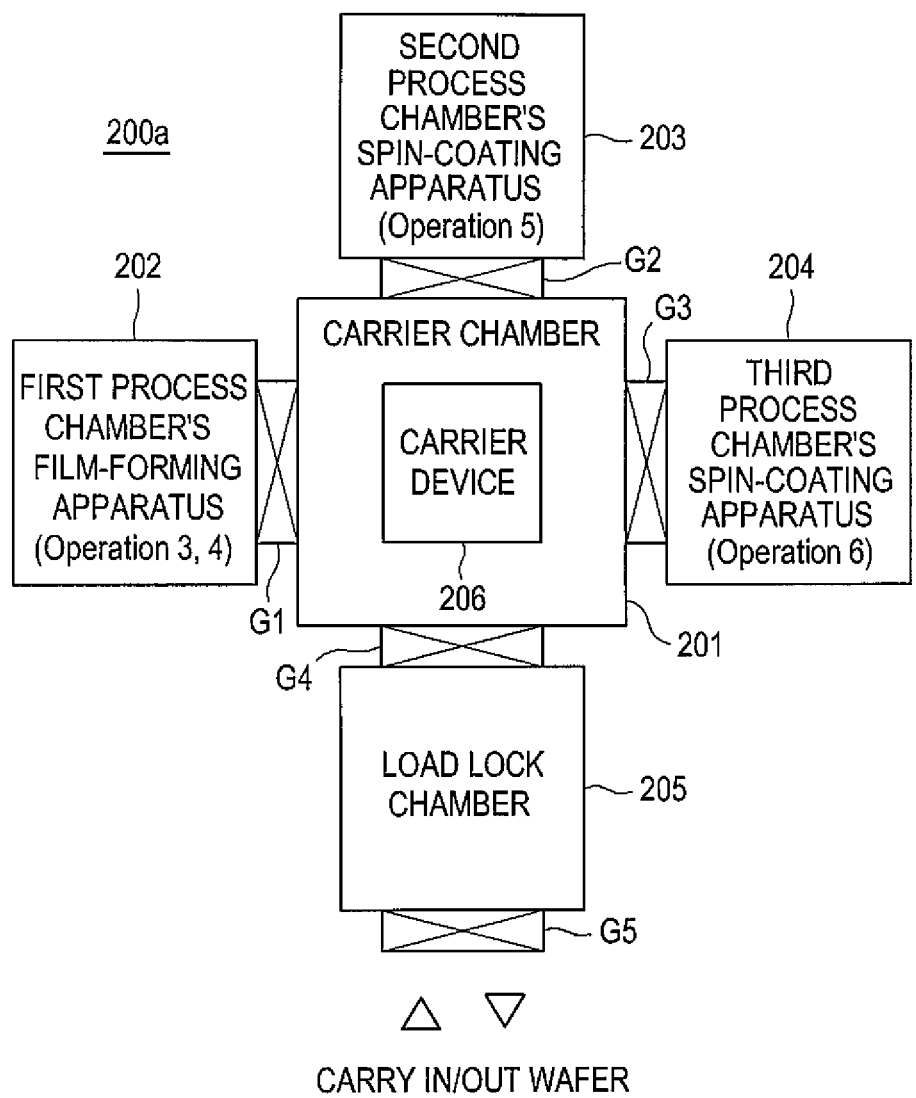
FIG. 13 is a block diagram illustrating a first example of a system for forming a film according to the present disclosure.

FIG. 13 is a block diagram illustrating a first example of the film-forming system.

As illustrated in FIG. 13, a film-forming system 200a according to the first example has process chambers 202, 203 and 204 and a load lock chamber 205 around a carrier chamber 201. The carrier chamber 201 is connected to the process chambers 202, 203 and 204 through gate valves G1 to G3. Also, the carrier chamber 201 is connected to the load lock chamber 205 through a gate valve G4.

The first process chamber 202 is a film-forming apparatus for forming the seed layer 8 and the silicon film in Operations 3 and 4.

In the first process chamber 202, the silicon substrate 1 having the trench 6 formed therein and the oxide film 7 formed at least on the sidewall of the trench 6 is heated. Thereafter, an aminosilane gas is supplied to the surface of the silicon substrate I to form the seed layer 8 on the silicon substrate 1 (e.g., on the oxide film 7 in this example). The silicon substrate 1 having the seed layer 8 formed thereon is heated, and a monosilane gas is supplied to the surface of the seed layer 8 to form the silicon film 9 on the seed layer 8. Further, before forming the silicon film, the seed layer 8 may be strengthened by supplying a higher order silane gas (e.g., disilane gas) than monosilane.

The second process chamber 203 is a spin-coating apparatus for coating the filling material 10 in Operation 5.

In the second process chamber 203, the trench 6 of the silicon substrate 1 having the silicon film 9 and the seed layer 8 formed thereon is filled with the filling material 10 that shrinks by burning. An example of the filling material 10 is a PHPS. The PHPS is burned to shrink and change into a silicon oxide.

The third process chamber 204 is a heat treatment apparatus for burning the filling material 10 filling the trench 6 in an atmosphere containing water and/or a hydroxy group and changing the silicon film 9 and the seed layer 8 into the silicon oxide 12.

In the third process chamber 203, the silicon substrate 1 coated with the filling material 10 is burned in an atmosphere containing water and/or a hydroxy group so as to change the filling material 10 into the silicon oxide 11 and change the silicon film 9 and the seed layer 8 into the silicon oxide 12, respectively.

The load lock chamber 205 is a pressure converting apparatus for converting the pressure between the pressure in the carrier chamber 201 and approximately the atmospheric pressure. The load lock chamber 205 has a gate valve G5 through which the silicon substrate 1 (e.g., the silicon wafer) is carried in/out. The gate valve G5 is connected to a carrier path (not shown) or a loader module (not shown).

A carrier apparatus 206 is disposed in the carrier chamber 201. The carrier apparatus 206 carries the silicon substrate 1 between the carrier chamber 201, the process chambers 202 to 204, and the load lock chamber 205.

The trench-filling method according to the first embodiment may be executed by using the film-forming system 200a to carry the silicon substrate 1 from the load lock chamber 205 through the carrier chamber 201 to the first process chamber 202, the second process chamber 203 and the third process chamber 204 sequentially.

Second Example

Figure 14:
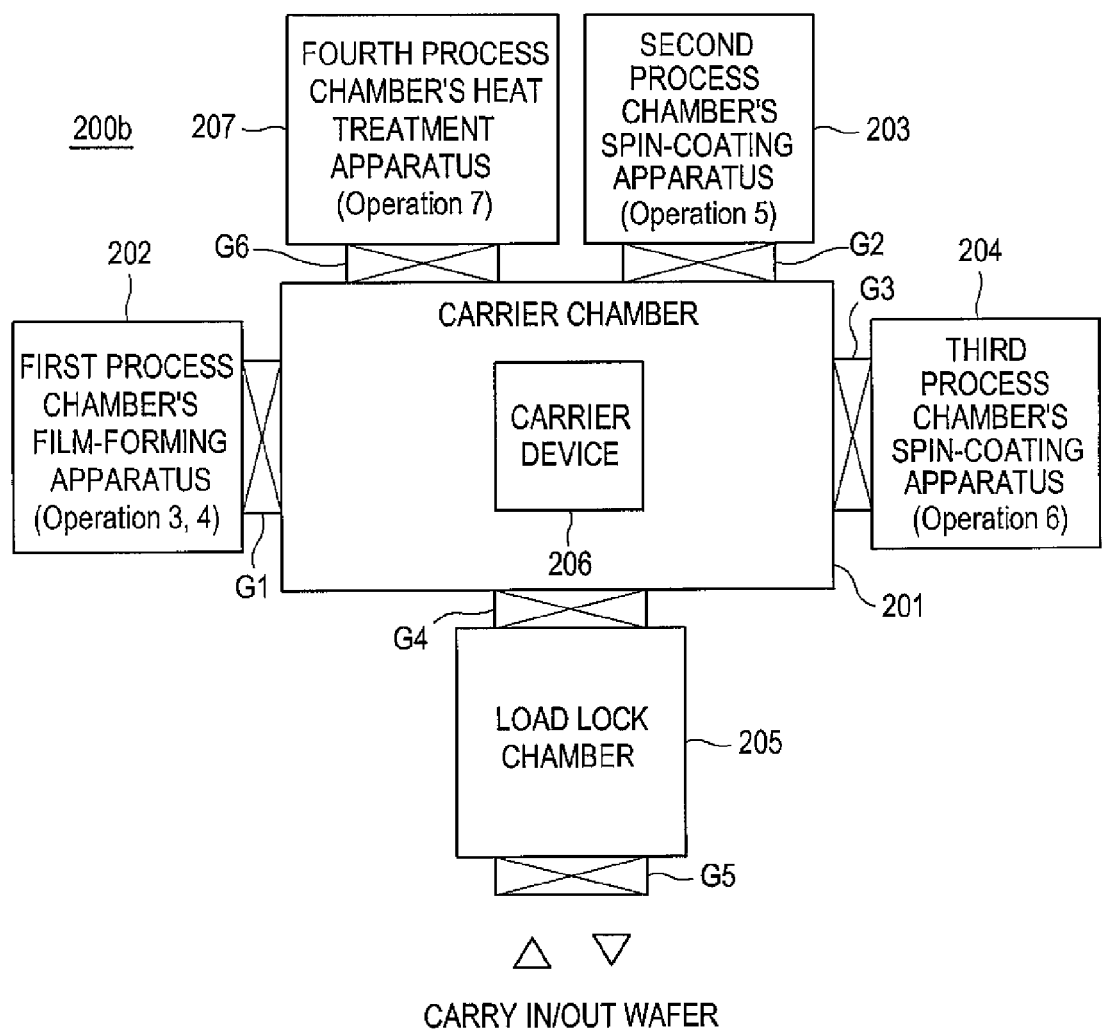
FIG. 14 is a block diagram illustrating a second example of a system for forming a film according to the present disclosure.

FIG. 14 is a block diagram illustrating a second example of the film-forming system.

As illustrated in FIG. 14, a film forming system 200b according to the second example is different from the film-forming system 200a in that it further includes a fourth process chamber 207. The fourth process chamber 207 is connected through a gate valve G6 to the carrier chamber 201.

The fourth process chamber 207 is a heat treatment apparatus for discharging a gas from the silicon film 9 and the seed layer 8 in Operation 7.

In the fourth process chamber 207, the silicon substrate 1 processed in the first process chamber 202 is heated to discharge a gas from the silicon film 9 and the seed layer 8.

The trench-filling method according to the second embodiment may be executed by using the film-forming system 200b to carry the silicon substrate 1 from the load lock chamber 205 through the carrier chamber 201 to the first process chamber 202, the fourth process chamber 207, the second process chamber 203 and the third process chamber 204 sequentially.

Third Example

Figure 15:
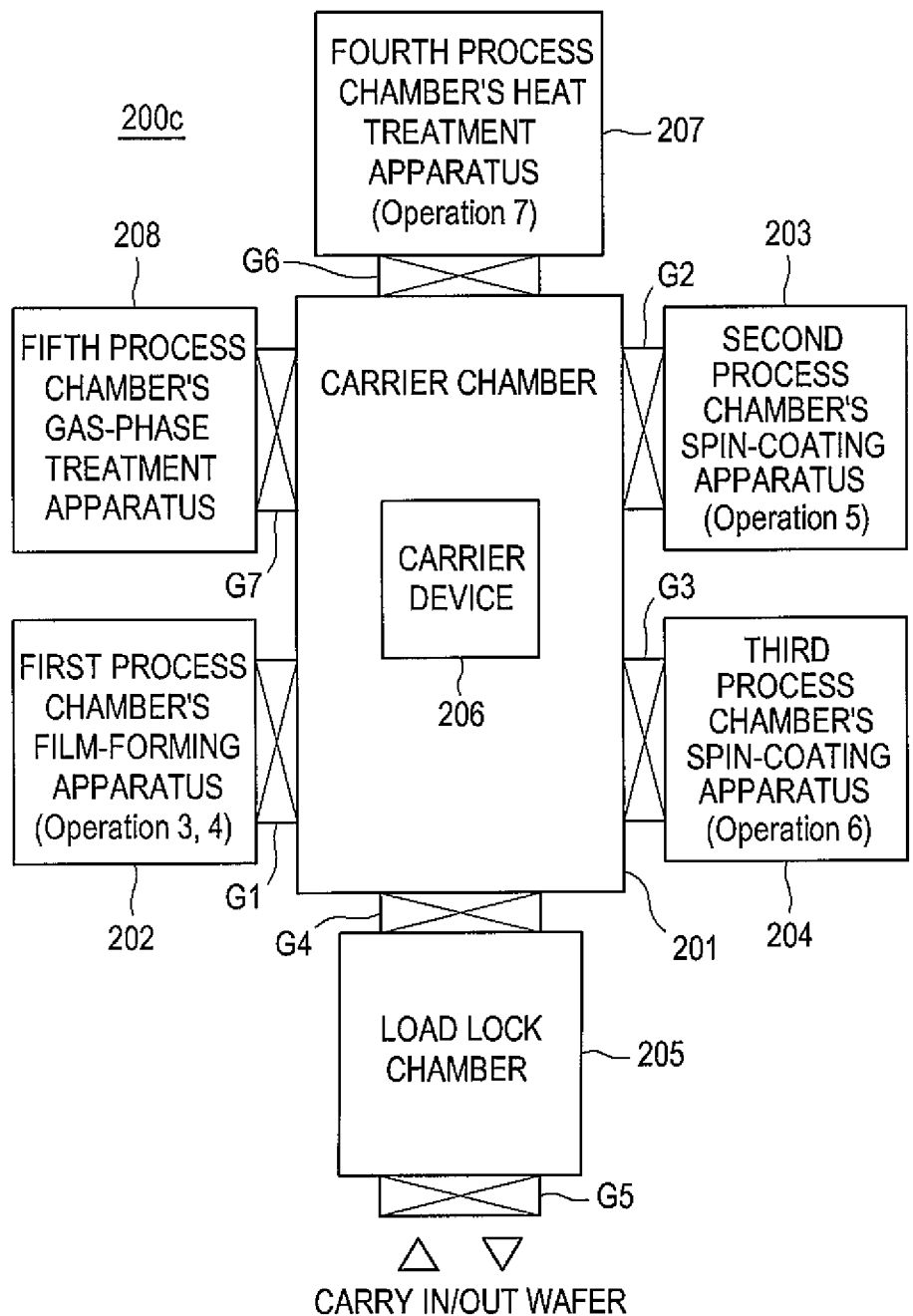
FIG. 15 is a block diagram illustrating a third example of a system for forming a film according to the present disclosure.

FIG. 15 is a block diagram illustrating a third example of the film-forming system according to the fourth embodiment of the present disclosure.

As illustrated in FIG. 15, a film-forming system 200c according to the third example is different from the film-forming system 200b in that it further includes a fifth process chamber 208. The fifth process chamber 208 is connected through a gate valve G7 to the carrier chamber 201.

The fifth process chamber 208 is a gas-phase treatment apparatus for forming a natural oxide film on the surface of the silicon film 9 before Operation 7.

In the fifth process chamber 208, the silicon substrate I processed in the first process chamber 202 is exposed to oxygen.

If a natural oxide film is formed on the surface of the silicon film 9, the trench-filling method according to the second embodiment may be executed in situ by using the film-forming system 200c to carry the silicon substrate 1 to the load lock chamber 205, the carrier chamber 201, the first process chamber 202, the fifth process chamber 208, the fourth process chamber 207, the second process chamber 203 and the third process chamber 204 sequentially.

Fourth Example

Figure 16:
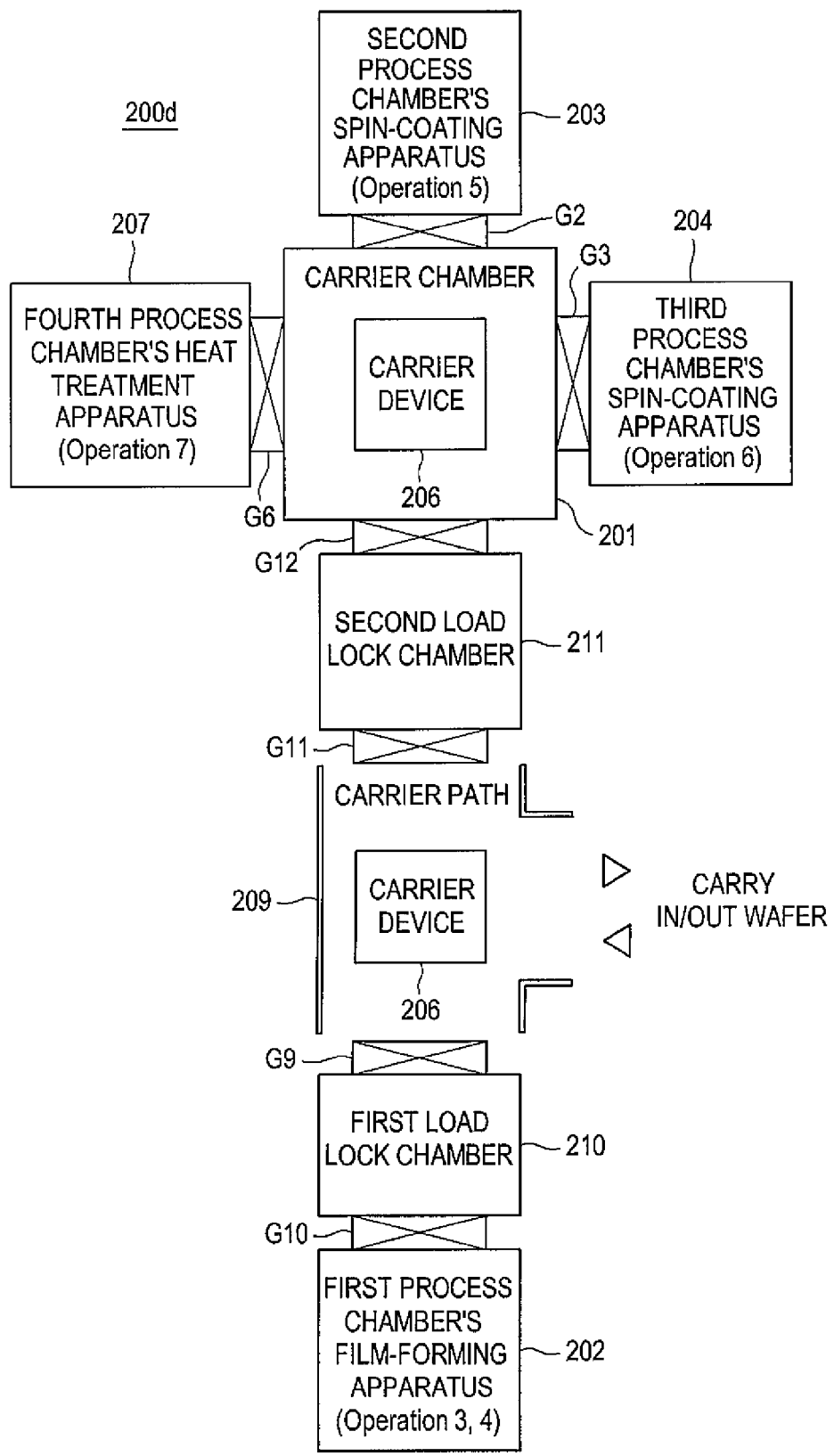
FIG. 16 is a block diagram illustrating a fourth example of a system for forming a film according to the present disclosure.

FIG. 16 is a block diagram illustrating a fourth example of the film-forming system.

As illustrated in FIG. 16, a film-forming system 200d according to the fifth example is different from the film-forming system 200c in that it includes a carrier path 209 instead of the fifth process chamber 208. The carrier path 209 is to carry the silicon substrate 1 in an air atmosphere.

One end of the carrier path 209 is connected through a gage valve G9 to a first load lock chamber 210, and the first load lock chamber 210 is connected through a gate valve G10 to the first process chamber 202.

Also, the other end of the carrier path 209 is connected through a gate valve G11 to a second load lock chamber 211, and the second load lock chamber 211 is connected through a gate valve G12 to the carrier chamber 201.

A carrier apparatus 212 is disposed on the carrier path 209. The carrier apparatus 212 carries the silicon substrate 1, which is carried from the outside of the film-forming system 200d, into the first load lock chamber 210, and carries the silicon substrate 1, which is carried out from the first load lock chamber 210, into the second load lock chamber 211. Also, the silicon substrate 1 carried out from the second load lock chamber 211 is carried to the outside of the film-forming system 200*d*.

If a natural oxide film is formed on the surface of the silicon film 9, the trench-filling method according to the second embodiment may be executed ex situ by using the film-forming system 200*d* to carry the silicon substrate 1 to the first load lock chamber 210, the first process chamber 202, the first load lock chamber 210, the carrier path 209, the second load lock chamber 211, the carrier chamber 201, the fourth process chamber 207, the second process chamber 203 and the third process chamber 204 sequentially.

While certain embodiments of the present disclosure have been described, the present disclosure is not limited to these embodiments and may be modified in various ways.

For example, although specific process conditions are illustrated in the above embodiments, the process conditions are not limited thereto.

According to the present disclosure, the occurrence of voids in the filling material can be suppressed even without forming an oxidation barrier film in the trench 6. This advantage is obtained by preflowing an aminosilane gas to the surface of the silicon substrate 1, forming the seed layer 8 on the surface of the silicon substrate 1, and supplying a monosilane gas to the seed layer 8 to perform a thermal decomposition operation to form the silicon film 9, thereby improving the step coverage.

Thus, the process conditions are not limited to those described in the above embodiments, and may be modified according to the size of the trench 6 and the capacity of the process chamber without degrading the above advantage.

Also, the trench filling method according to the above embodiment is suitable for use in a semiconductor device manufacturing process because it can fill the fine trench 6 without the occurrence of voids therein.

Also, the trench is suitable for used in a device isolation region of a semiconductor device.

Also, when the seed layer 8 is thick, it degrades the miniaturization of a semiconductor device. The seed layer 8 generates the nucleus of silicon uniformly, thus facilitating the adsorption of a monosilane. Accordingly, it is preferable that the seed layer 8 is thin. Preferably, the seed layer 8 may have a thickness of a monoatomic layer level. As described above, the preferable thickness of the seed layer 8 is 0.1 nm to 0.3 nm.

Also, although a material coated by a spin-coating process, i.e., a PHPS is illustrated as an example of the filling material 10, the filling material 10 is not limited to a material coated by a spin-coating process, but may be a film formed by a CVD process.

For example, like the PHPS, a film formed by a CVD process (e.g., a silicon oxide film) is also shrunk when being burned (thermally treated) to increase the film quality.

The embodiments of the present disclosure may also be applicable to any other film that shrinks when being burned.

The novel methods and systems described herein may be embodied in a variety of other forms without departing from the spirit of the disclosure.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of filling a trench, comprising:
heating a semiconductor substrate having a trench formed therein and an oxide film formed at least on the sidewall of the trench and supplying an aminosilane gas to the surface of the semiconductor substrate so as to form a seed layer on the semiconductor substrate;
heating the semiconductor substrate having the seed layer formed thereon and supplying a monosilane gas to the surface of the seed layer so as to form a silicon film on the seed layer;
filling the trench of the semiconductor substrate, which has the silicon film formed thereon, with a filling material that shrinks by burning; and
burning the semiconductor substrate coated by the filling material filling the trench in an atmosphere containing water and/or a hydroxy group while changing the filling material into a silicon oxide and changing the silicon film and the seed layer into a silicon oxide;
heating the semiconductor substrate having the seed layer formed thereon and supplying a higher order silane gas than monosilane to the surface of the seed layer between said forming the seed layer and said forming the silicon film.

2. The method of claim 1, further comprising, between said forming the silicon film and said filling the trench, heating the semiconductor substrate having the silicon film and the seed layer formed thereon and discharging a gas from the silicon film and the seed layer.

3. The method of claim 2, further comprising exposing the semiconductor substrate, which has the silicon film and the seed layer formed thereon, to oxygen between said forming the silicon film and said discharging the gas after forming the silicon film and said filling the trench are performed in situ.

4. The method of claim 2, further comprising carrying the semiconductor substrate, which has the silicon film and the seed layer formed thereon, in an air atmosphere between said forming the silicon film and said discharging the gas after forming the silicon film and said filling the trench are performed ex situ.

5. The method of claim 1, wherein the silicon film and the seed layer expand when being changed into the silicon oxide, and the thickness of the silicon film and the thickness of the seed layer are set such that the sum of double of the expansion amount of the silicon film and double of the expansion amount of the seed layer is equal to the shrinkage amount of the filling material.

6. The method of claim 5, wherein the sum of double of the thickness of the oxide film, double of the thickness of the silicon film after the expansion thereof, double of the thickness of the seed layer after the expansion thereof, and the thickness of the filling material after the shrinkage thereof is set to be equal to the width of the trench.

7. The method of claim 5, wherein the thickness of the silicon film is set to be greater than the thickness of the seed layer.

8. The method of claim 1, wherein the aminosilane gas comprises at least one of butylaminosilane (BAS), bistertiarybutylaminosilane (BTBAS), dimethylaminosilane (DMAS), bisdimethylaminosilane (BDMAS), tridimethylaminosilane (TDMAS), diethylaminosilane (DEAS), bisdiethylaminosilane (BDEAS), dipropylaminosilane (DPAS), and diisopropylaminosilane (DIPAS).

9. The method of claim 1, wherein the oxide film formed at least on the sidewall of the trench is formed by radical-oxidizing or plasma-oxidizing the semiconductor substrate having the trench formed therein.

10. The method of claim 1, wherein said method of filling the trench is used in a process of manufacturing a semiconductor device.

11. The method of claim 10, wherein the trench is used in a device isolation region inside the semiconductor device.

* * * * *